United States Patent [19]

Amano

[11] Patent Number: 4,609,908
[45] Date of Patent: Sep. 2, 1986

[54] REPEAT CONTROL APPARATUS FOR A POLLING TYPE SERIAL INTERFACE KEYBOARD APPARATUS

[75] Inventor: Katsumi Amano, Tokyo, Japan

[73] Assignee: Tokyo Shibaura Denki Kabushiki Kaisha, Kawasaki, Japan

[21] Appl. No.: 530,461

[22] Filed: Sep. 8, 1983

[30] Foreign Application Priority Data

Sep. 14, 1982 [JP] Japan ................................. 57-159962

[51] Int. Cl.$^4$ .............................................. G06F 3/02
[52] U.S. Cl. ............................ 340/365 S; 340/365 R; 400/476
[58] Field of Search ....................... 340/365 R, 365 S; 364/900, 200; 400/479, 476

[56] References Cited

U.S. PATENT DOCUMENTS

| | | | |
|---|---|---|---|
| 3,755,691 | 8/1973 | Cassarino . | |
| 4,200,926 | 4/1980 | Cochran | 340/365 S |
| 4,263,582 | 4/1981 | Dumboric | 340/365 S |
| 4,305,065 | 12/1981 | Mogi | 340/365 S |
| 4,323,888 | 4/1982 | Cole | 340/365 S |
| 4,346,369 | 8/1982 | Macy | 340/365 S |
| 4,408,191 | 10/1983 | Fowler | 340/365 S |
| 4,470,038 | 9/1984 | Amano | 340/365 S |
| 4,482,955 | 11/1984 | Amano | 340/365 S |
| 4,502,039 | 2/1985 | Vercesi | 340/365 S |

FOREIGN PATENT DOCUMENTS 2332655 11/1975 France .
2057171 3/1981 United Kingdom .

OTHER PUBLICATIONS

Radio Fernsehen Elektronik, vol. 28, No. 12, Dec. 1979, Berlin, (DE), pp. 795-798, R. Bauch: "Handeingabesysteme fur Prozess-steuerungen auf Mikrorechnerbasis", p. 795, col. 1-col. 2, lines 1-20; p. 797, col. 3, lines 1-8; FIG. 4.
Electro/81 Conference Record, vol. 6, Apr. 7-9, 1981, pp. 1-9, New York, (US). G. E. Charest: "Distributed Microprocessor Control with IPC's", pp. 1-3; FIGS. 2, 3.
Wireless World, vol. 87, No. 1545, Jun. 1981, Sheepen Place, pp. 77-78, Colchester, (GB), M. D. Alger et al.: "Remote Keyboard Interface", p. 78, paragraph: Circuit Operation.
Hewlett Packard Journal, Jun., 1975, US, pp. 20-21, Otakar Blazek: "A Microprocessor-Scanned Keyboard".

Primary Examiner—John W. Caldwell, Sr.
Assistant Examiner—Michael F. Heim
Attorney, Agent, or Firm—Kenyon & Kenyon

[57] ABSTRACT

A repeat control apparatus for a serial keyboard interface apparatus has a one-chip microprocessor which serves as a keyboard controller. A RAM section in the microprocessor includes an area for holding a set value $RCD_A$ for repeat start timing control, an area for holding a set value $RCD_B$ for repeat time interval control, a counter area for permitting $RCD_A$ to be set as a preset value and for making a sequential down count according to the number of pollings from a terminal main unit, and a counter area for permitting $RCD_B$ to be set as a preset value and for making a sequential down count according to the number of pollings from the terminal main unit. The terminal main unit performs the polling operation with respect to a keyboard controller. The number of pollings is counted on the side of the keyboard controller, after the key operation has been performed. When the count value reaches a value initially set from the terminal main unit, a repeat operation is executed. A specific code is added to a key code input from a repeat function-equipped key, through the keyboard controller, which code shows that the key code is a repeat key code. The terminal main unit performs a key input control function with respect to a key code which permits a repeat key operation; and with respect to a key code which does not permit such repeat key operation.

4 Claims, 10 Drawing Figures

| START BIT | DATA (COMMAND) | | | | | | | P0 | PARITY BIT | STOP BIT |
|---|---|---|---|---|---|---|---|---|---|---|
| | b0 | b1 | b2 | b3 | b4 | b5 | b6 | | | |

FIG. 7

| START BIT | DATA | | | | | | | | PARITY BIT | STOP BIT |
|---|---|---|---|---|---|---|---|---|---|---|
| | b0 | b1 | b2 | b3 | b4 | b5 | b6 | b7 | | |

REPEAT CONTROL APPARATUS FOR A POLLING TYPE SERIAL INTERFACE KEYBOARD APPARATUS

BACKGROUND OF THE INVENTION

This invention relates to a repeat control apparatus for a serial interface keyboard apparatus, which is adapted to cause a key code input via a key operation on a keyboard to be sent in a bit serial mode to a host unit, such as a terminal main unit.

Figure 1:
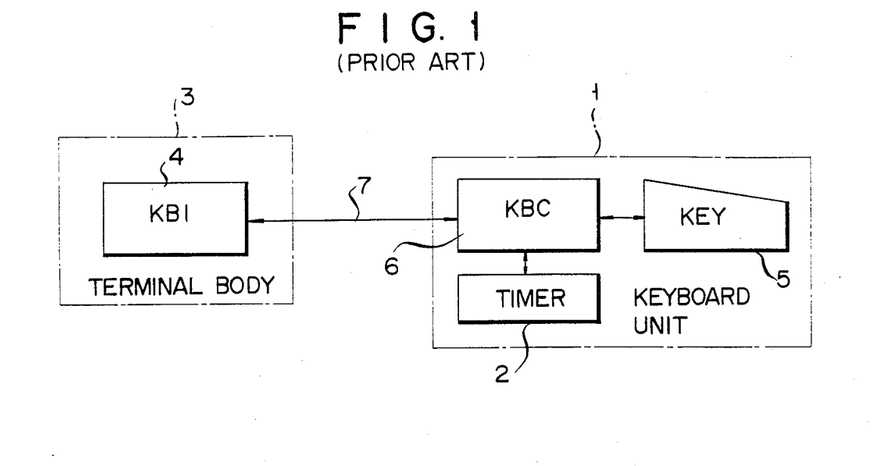
FIG. 1 is a block diagram showing an arrangement of a conventional serial interface keyboard apparatus and terminal main unit.

A conventional serial interface keyboard apparatus 1 of this type includes a timer 2, as shown in FIG. 1. The repeat time interval of the key required in a repeat operation is determined by the time count control of the timer. The apparatus of FIG. 1 comprises a host unit (a terminal main unit) 3, a keyboard interface controller KB 4 for performing serial interface control with respect to the keyboard apparatus 1, a key matrix section KEY 5, a keyboard controller KBC 6 for performing serial interface function, and a signal line 7 connected between the keyboard apparatus 1 and the host unit 3.

Figure 2:
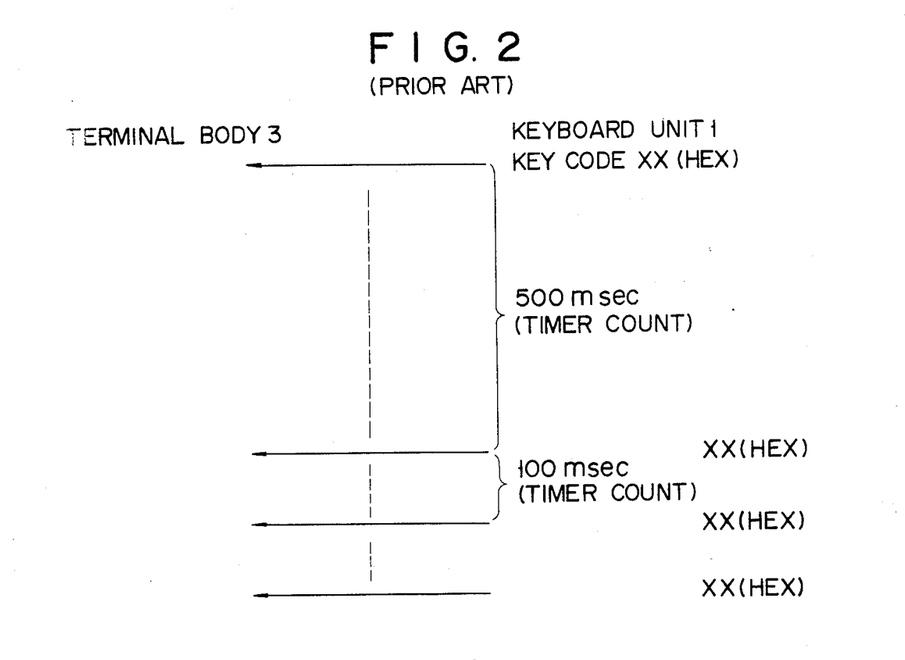
FIG. 2 is an explanatory view showing the state in which signals are sent, in connection with a conventional repeat control operation.

The repeat control operation of the conventional keyboard apparatus 1 may be explained as follows, with reference to FIG. 2. Upon depression of a key (with key code $XX_H$, a hexadecimal) on the key matrix section 5 of the keyboard apparatus 1, the code $XX_H$ belonging to the key is transferred in a bit serial mode to the host unit 3, through the signal line; and, at the same time, the timer 2 starts to effect a time count operation. When the timer 2 counts, e.g., 500 msec., a repeat operation is started, i.e., a repeat operation is performed for every 100 msec.

However, such a conventional repeat control means has a drawback, in that the keyboard apparatus 1 requires a timer 2 for repeat control, thus complicating the hardware configuration. Furthermore, since the repeat time interval (500 msec., 100 msec. in FIG. 2) is fixed by the hardware, it is not possible to arbitrarily change the repeat time interval without changing the associated hardware. The host unit 3 cannot distinguish the keyed-in code, when the repeat operation is being carried out by the operation of the timer, from the keyed-in code when an operator performs input operations a number of times. It is therefore impossible to distinguish a repeatable keyed-in code from the keyed-in code which is not repeatable (a specific function key). Thus, the conventional apparatus includes disadvantages which are both structural and functional.

SUMMARY OF THE INVENTION

One object of this invention is to provide a repeat control apparatus for a sequential interface keyboard apparatus which can obviate the necessity of providing a timer for repeat control, simplify the associated hardware and freely set a repeat time interval.

Another object of this invention is to provide a repeat control apparatus for a sequential interface keyboard apparatus, which can readily and positively determine, on the host unit side, whether the keyed-in data is repeat keyed-in data.

According to this invention, a repeat control apparatus for a sequential interface keyboard apparatus is provided, which is so adapted as to cause a key code input by the operation of a key on a keyboard to be sent in a bit serial mode from the keyboard apparatus to a host unit; said repeat control apparatus comprising: first holding means for holding a value for repeat start timing control, which is set with a time interval of a polling from the host unit, as a unit; second holding means for holding a value for repeat interval control, which is set with a predetermined repeat time interval of the polling from the host unit, as a unit; count means for permitting the contents of the first and second holding means to be set at different times and for effecting a count up to a predetermined number on the basis of a control signal from the host unit; and means for sending the key code corresponding to the operated key to the host unit (when the count means effects a count up), to the repeat start time, or over a predetermined repeat time interval.

BRIEF DESCRIPTION OF THE DRAWINGS

Other objects and features of this invention may be understood through the following description, in conjunction with the accompanying drawings, in which.

DETAILED DESCRIPTION OF THE PREFERRED EMBODIMENT

One embodiment of this invention may be explained as follows, with reference to the accompanying drawing sheets.

Figure 3:
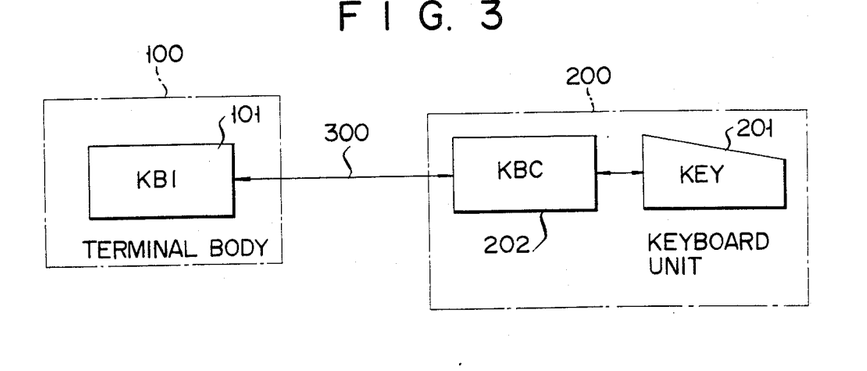
FIG. 3 is a block diagram showing the entire arrangement of a serial interface keyboard apparatus according to one embodiment of this invention.
Figure 4:
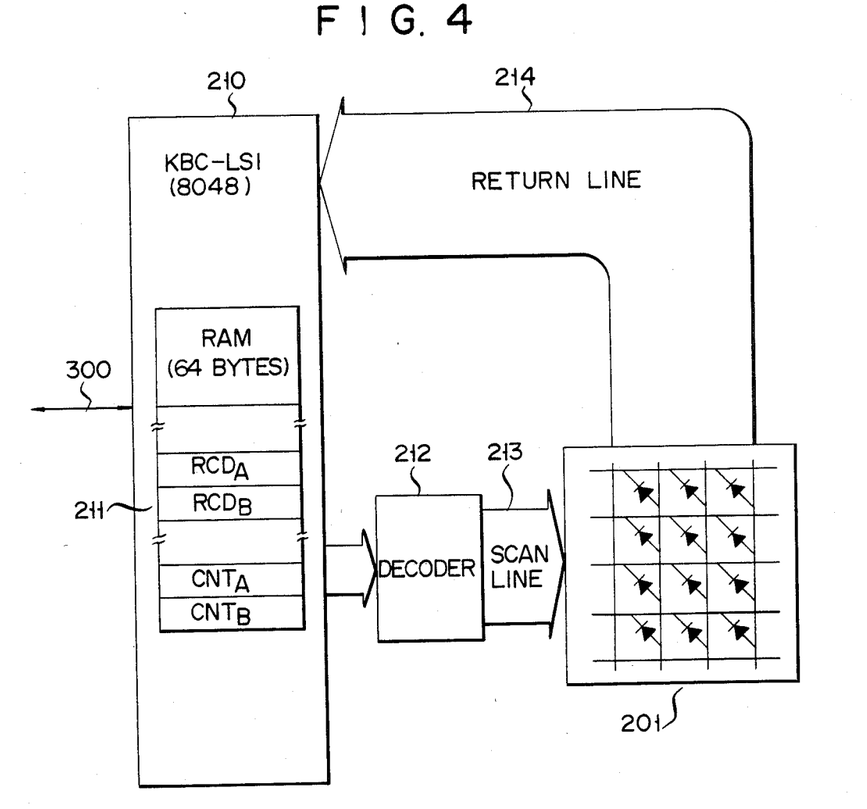
FIG. 4 is a block diagram showing the circuit arrangement of a keyboard controller of the embodiment of FIG. 3.
Figure 5:
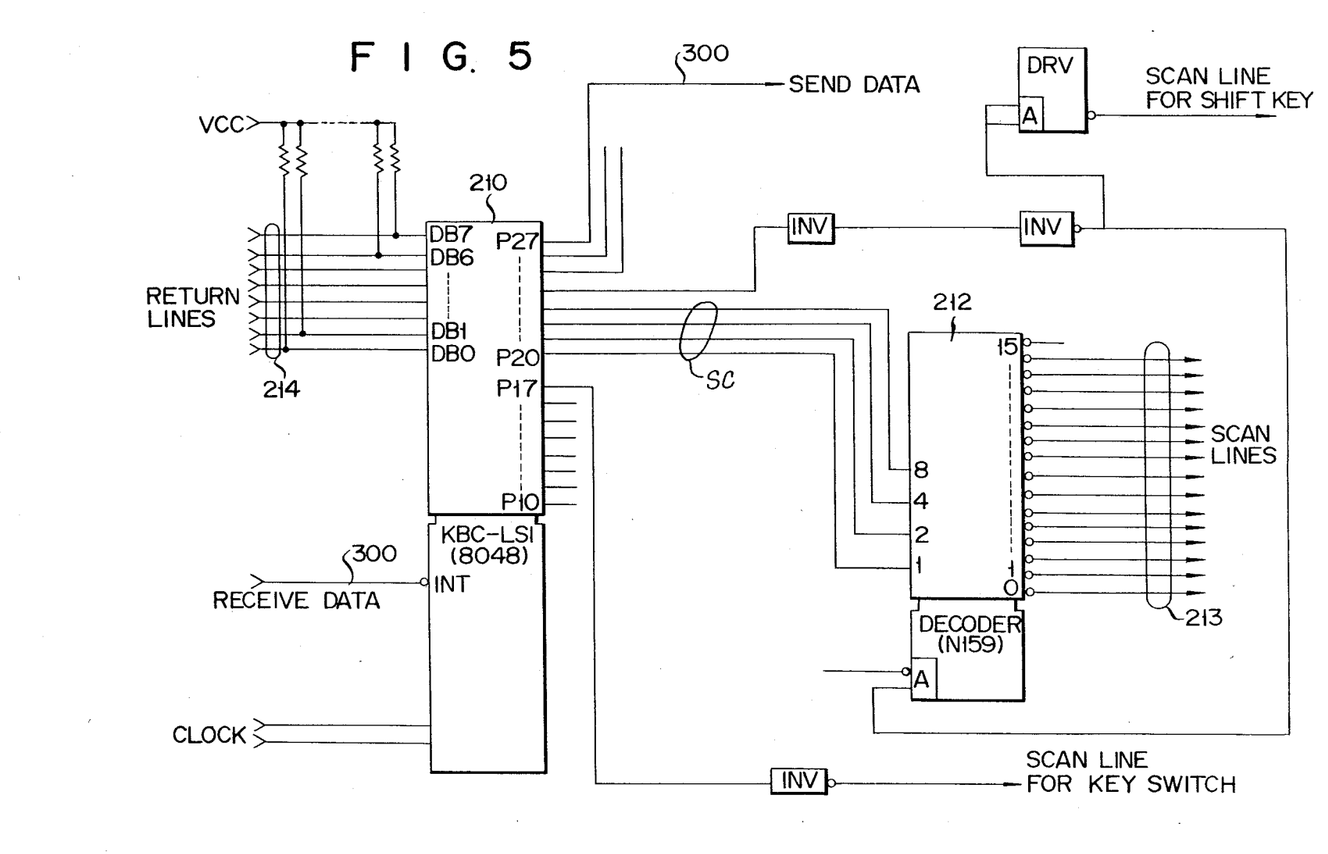
FIG. 5 is a circuit block diagram showing a detail of the circuit arrangement of FIG. 4.

FIG. 3 is a block diagram showing the entire arrangement of a serial interface keyboard apparatus according to one embodiment of this invention. FIG. 4 is a block diagram showing an arrangement of the serial interface keyboard apparatus 200 shown in FIG. 3. FIG. 5 is a block diagram showing the keyboard controller 202 shown in FIG. 4. In FIG. 3, a terminal main unit 100, such as a processing unit, controls the keyboard 200 as one peripheral unit. The keyboard apparatus 200 is connected to the terminal main unit 100, through a serial interface line 300. A keyboard interface controller KBI 101 in the terminal main unit 100 has a serial interface control function and permits data transfer to and from the keyboard apparatus 200, through the serial interface line 300. The keyboard interface controller 101 sends polling data (POL) to the keyboard apparatus for each predetermined cycle (for example, 200 msec). The keyboard apparatus 200 consists of a keyboard section KB 201 comprised of a matrix array of data keys and function keys, and a keyboard controller KBC 202 having a serial interface control function. The controller KBC 202 is comprised of the one-chip microprocessor KBC-LSI 210 shown in FIGS. 4 and 5. Model 8048 (Intel Corporation), for example, can be used as the microprocessor. A portion (2 bytes) of a RAM 211 in the microprocessor KBC-LSI is used as a repeat control counter ($CNT_A$, $CNT_B$). Counter $CNT_A$ permits a set value $RCD_A$ for repeat start timing control to be preset and performs a sequential down count. Counter $CNT_B$ permits a set value $RCD_B$ for repeat time interval control to be preset and performs a sequential down count. Although, for ease of explanation, counters $CNT_A$ and $CNT_B$ are separately shown; in actual practice, the set values $RCD_A$, $RCD_B$ may be selectively supplied as preset data to one counter (one byte), for counting the number of pollings. In this case, a total of 3 bytes may be used: one byte for a subtraction counter, and two bytes for holding the preset values $RCD_A$, $RCD_B$.

In FIG. 4, the microprocessor KBC-LSI 210 in the controller KBC 202 has a 64-byte RAM, including preset value holding areas $RCD_A$, $RCD_B$ and subtraction counters $CNT_A$ and $CNT_B$ KBC-LSI 210 delivers a scan signal SC, as an output signal to the keyboard 201. This scan signal SC is supplied to a decoder 212 connected to the output of KBC-LSI 210, where it is decoded to produce scan signal KBC. Scan signal KBC is supplied through a scan line 213 to the keyboard section 201, and a key code signal corresponding to the operated key is sent to KBC-LSI 210 through a return-line 214. FIG. 5 shows a detailed circuit of KBC-LSI 210 and decoder 212.

Figure 6:
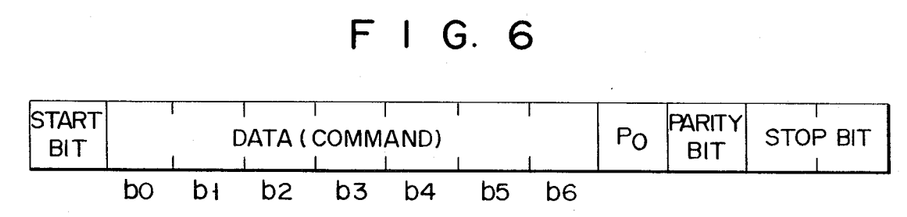
FIGS. 6 and 7 each show the command/data transmission format of the embodiment of this invention.
Figure 7:
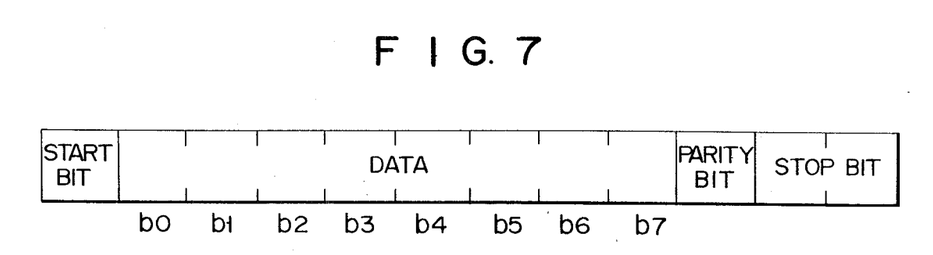
Figure 8:
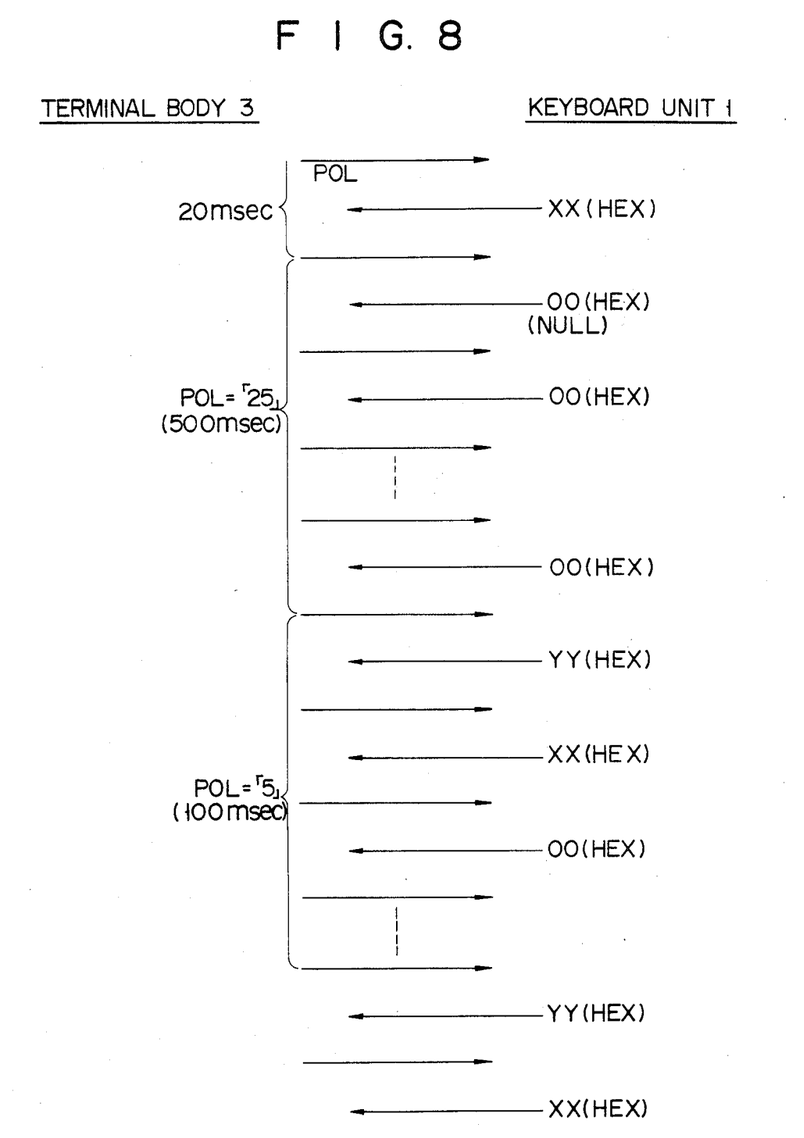
FIG. 8 is a view showing the signal transmission/reception format of the embodiment of this invention.
Figure 9:
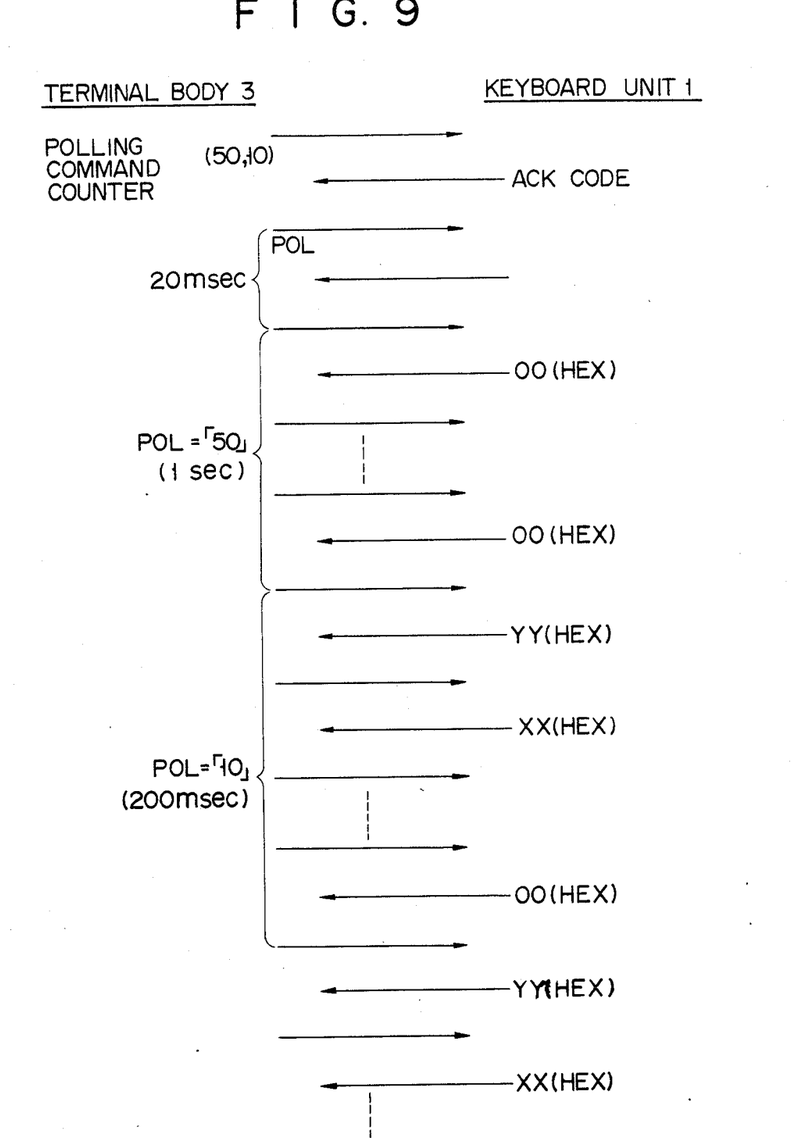
FIG. 9 is a view showing a modified signal transmission/reception format of FIG. 8.
Figure 10:
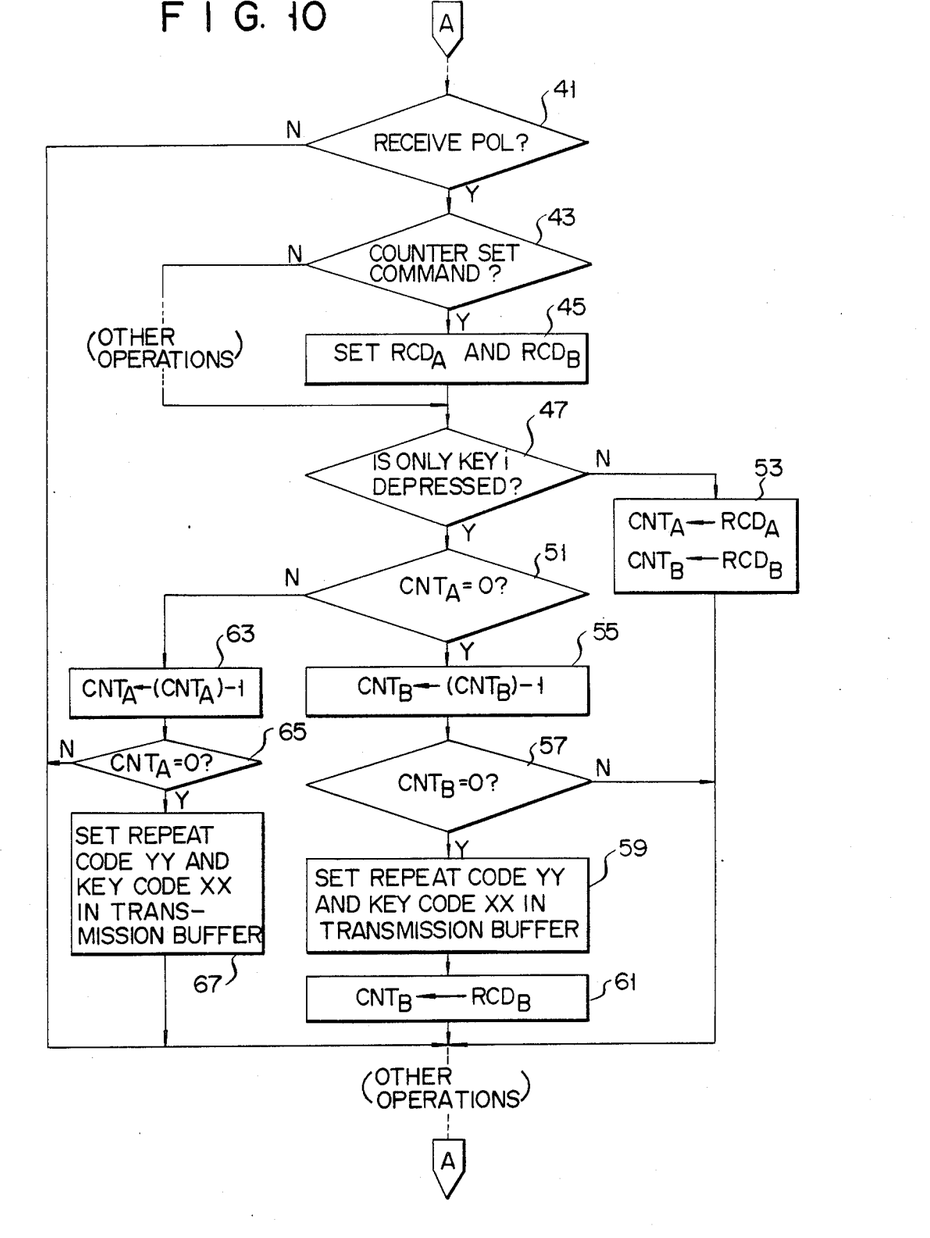
FIG. 10 is a flow chart showing the operation of the embodiment of this invention.

FIGS. 6 to 10 are views explaining the operation of the embodiment of this invention. FIG. 6 shows a data transfer format, from the terminal main unit to the keyboard apparatus; FIG. 7 shows a data transfer format, from the keyboard apparatus to the terminal main unit 100; FIGS. 8 and 9 each show a signal transfer between the terminal main unit 100 and the keyboard apparatus; and FIG. 10 shows a flow chart for a repeat control apparatus.

The operation of the embodiment of this invention may be explained as follows, with reference to the flow chart of FIG. 10.

The keyboard interface controller 101 in the terminal main unit 100 performs a polling operation every 20 msec, as shown in FIG. 8. A polling data format is shown in FIG. 6. For a command, 1 is set to the flag $P_0$ of a bit 7; while, for the polling operation, "0" is set to the flag $P_0$. A signal sent from the interface controller 101 in the terminal main unit 100 is received by the keyboard controller 202 in the keyboard apparatus through a serial interface line 300. The keyboard controller 202 judges whether or not the received signal is a polling signal (step 41, FIG. 10). If the answer is in the affirmative, the process goes to step 43, where judgement is made as to whether or not a command from the interface controller 101, which follows the polling signal, is a counter set command. If the answer is in the affirmative, the process goes to step 45. At step 45, the set values $RCD_A$, $RCD_B$ for repeat control which are sent in a sequential fashion are stored at specific address locations in RAM 211, in KBC-LSI 210. At step 47, a judgement is made as to whether or not any key (KEYi) is depressed. If the answer is in the negative, the set values $RCD_A$, $RCD_B$ are set as preset values to the counters $CNT_A$, $CNT_B$ in RAM 211. In this connection, it is to be noted that the set values may be contained in the counter set command. Supposing that, as shown in FIG. 8, the time period from depression of the key to the start of a repeat operation is 500 msec and the repeat time interval is 100 msec, $RCD_A$="25" will be set to $CNT_A$ in the RAM and $RCD_B$="5" will be set to $CNT_B$ in the RAM.

If, at step 47, a repeat function-equipped key (KEYi) on the keyboard section 201 is judged as being depressed, a key code ($XX_{HEX}$) corresponding to that key is output from KBC-LSI 210 in the controller 202, in response to the polling operation, and is delivered to the controller 101 in the terminal main unit 100, through the serial interface line 300. FIG. 7 shows a data transmission format, from the keyboard apparatus to the terminal main unit 100. Even after key code $XX_{HEX}$ has been delivered, polling data is sent at a time interval of 20 msec, from controller 101 to controller 202. If, in this case, the above-mentioned key (KEYi) alone, continues to be depressed, with the other keys being left untouched, NULL ($00_{HEX}$) is sent from KBC-LSI 210 to the controller 101 in the terminal main unit 100, in place of key code $XX_{HEX}$, in response to the polling operation. At step 51, a check is made as to whether or not the contents of $CNT_A$ is zero. If the contents of $CNT_A$ is not zero, the process goes to step 63. KBC-LSI 210 in controller 202 causes the contents of $CNT_A$ to be counted down, according, to the number of pollings. At step 65, when the contents of $CNT_A$ is judged as being zero; or, when the number of pollings is equivalent to 25 counts, the process goes to step 67. The repeat code $YY_{HEX}$ and key code $XX_{HEX}$ which corresponds to the depressed key KEYi are sequentially set to an internal transmitting buffer and delivered through the serial interface line 300 to the controller 101 in the terminal main unit 100. If, alternatively, at step 51 the contents of $CNT_A$ is judged as being zero, i.e., when the repeat start timing is reached, the process goes to step 55, providing that the key KEYi is depressed. The contents of $CNT_B$ is sequentially counted down according to the number of pollings. At step 57, when the contents of $CNT_B$ is judged as being zero, i.e., when the number of pollings is equivalent to S counts, the repeat time interval is 100 msec. At step 59, the repeat code $YY_{HEX}$ and key code $XX_{HEX}$ are again sequentially set to the internal transmitting buffer and delivered through the serial interface line 300 to the controller 101 in the terminal main unit 100. At step 61, a preset value $RCD_B$ is again set to $CNT_B$. In this way, a repeat control function is performed.

Upon receipt of the key code $XX_{HEX}$ followed by the repeat code $YY_{HEX}$, the terminal main unit 100 judges whether or not the key is that key which is allowed to be repeated. If the answer is in the affirmative, the corresponding code is treated as a repeat key input code and displayed on a CRT display section (not shown).

Although, in the above-mentioned embodiment, the number of pollings has been counted by $CNT_A$ and $CNT_B$ under condition in which, at $RCD_A$=25 and $RCD_B$=5, the repeat start time interval (i.e., the time interval from the depression of the key to the starting of the repeat operation) is 500 msec and the repeat time interval is 100 msec, the repeat start time interval and repeat time interval can be arbitrarily determined by a counter set command, by setting new values as $RCD_A$ and $RCD_B$. As shown in FIG. 9, for example, the repeat start time interval and repeat time interval can be set to 1 sec and 200 msec, respectively. In this case, $RCD_A$=50 and $RCD_B$=10 are sent as new values to the controller 202 by the above-mentioned counter set command and are stored in the specific address locations of the RAM in KBC-LSI 210, in such a way as to updata their contents. At the same time, these new values are set to $CNT_A$ and $CNT_B$, and the repeat operation count control is effected in response to the polling from the terminal main unit. Although, in the above-mentioned embodiment, the polling time interval has been set to 20 msec, the repeat time interval can be varied by varying the polling cycle.

What is claimed is:

1. A repeat control apparatus for a keyboard apparatus, which is adapted to cause a key code input by a key operation to be sent in a bit serial mode from the keyboard apparatus to a host unit, which repeat control apparatus comprises:

first holding means for holding a first value for repeat start time control, which is set with a polling time interval from the host unit, as a unit;

second holding means for holding a second value for repeat time interval control, which is set with the polling time interval from the host unit, as a unit;

count means, coupled to the first and second holding means, for permitting the contents of the first and second holding means to be set at different times and for making a count up to a predetermined number, on the basis of a polling signal from the host unit; and means, coupled to the count means, for sending said key code to the host unit when the count means makes a count up to a repeat start time stored in the first holding means or over a predetermined repeat time interval stored in the second holding means.

2. A repeat control apparatus of claim 1, wherein said first and second set values can be arbitrarily set by the host unit.

3. A repeat control apparatus according to claim 1, further comprising means for generating a specific code showing that said code is a repeat key code; and, wherein, when a count value of said count means reaches a set value corresponding to the repeat time interval, the key code repeated and the specific code are sent to the host unit.

4. A repeat control apparatus according to claim 1, wherein said means for sending the key code corresponding to the operated key to the host unit when the count means makes a count up to the repeat start time or over the predetermined repeat time interval is comprised of a microcomputer.

* * * * *